United States Patent
Du et al.

(10) Patent No.: US 10,423,062 B2
(45) Date of Patent: Sep. 24, 2019

(54) METHOD FOR CORRECTING TARGET PATTERNS AND MASK HAVING CORRECTED TARGET PATTERNS

(71) Applicants: Semiconductor Manufacturing International (Shanghai) Corporation, Shanghai (CN); Semiconductor Manufacturing International (Beijing) Corporation, Beijing (CN)

(72) Inventors: Yao Jun Du, Shanghai (CN); Liang Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 153 days.

(21) Appl. No.: 15/667,956

(22) Filed: Aug. 3, 2017

(65) Prior Publication Data

US 2018/0059533 A1     Mar. 1, 2018

(30) Foreign Application Priority Data

Aug. 31, 2016    (CN) .......................... 2016 1 0788930

(51) Int. Cl.
    *G03F 1/36*          (2012.01)
    *G06F 17/16*        (2006.01)
    *G03F 7/20*          (2006.01)

(52) U.S. Cl.
    CPC ............. *G03F 1/36* (2013.01); *G03F 7/70433* (2013.01); *G03F 7/70441* (2013.01); *G06F 17/16* (2013.01)

(58) Field of Classification Search
    CPC .... G03F 1/36; G03F 7/70433; G03F 7/70441; G06F 17/16

USPC ............................................................. 430/5
See application file for complete search history.

(56) References Cited

U.S. PATENT DOCUMENTS

| | | |
|---|---|---|
| 2008/0098341 A1 | 4/2008 | Kobayashi et al. |
| 2012/0216156 A1 | 8/2012 | Liu et al. |
| 2015/0040078 A1 | 2/2015 | Verma et al. |
| 2015/0067619 A1 | 3/2015 | Hsuan et al. |
| 2015/0169820 A1 | 6/2015 | Wang |

OTHER PUBLICATIONS

The European Patent Office (EPO) The Extended European Search Report for 17186994.4 dated Feb. 1, 2018 9 Pages.

*Primary Examiner* — Christopher G Young
(74) *Attorney, Agent, or Firm* — Anova Law Group, PLLC

(57) ABSTRACT

Methods for correcting target patterns and masks having corrected target patterns are provided. An exemplary correction method includes dividing contours of target patterns into fragments; performing an optical proximity correction to obtain mask patterns; obtaining simulated exposure patterns; detecting the simulated exposure patterns to find out existence of at least one weak point; determining a correction window in the target patterns; comparing the target patterns in the correction window with the simulated exposure patterns to obtain a position error of each fragment; calculating an effect value of a correction value of each fragment in the correction window on position errors of all fragments in the correction window; determining the correction value of each fragment according to the effect value of the correction value in the correction window on position errors of all fragments and the position error of each fragment; and obtaining corrected target patterns using the correction value.

20 Claims, 3 Drawing Sheets

METHOD FOR CORRECTING TARGET PATTERNS AND MASK HAVING CORRECTED TARGET PATTERNS

CROSS-REFERENCES TO RELATED APPLICATIONS

This application claims the priority of Chinese patent application No. 201610788930.7, filed on Aug. 31, 2016, the entirety of which is incorporated herein by reference.

FIELD OF THE DISCLOSURE

The present invention generally relates to the field of semiconductor manufacturing technologies and, more particularly, relates to methods for correcting target patterns and masks having corrected target patterns in photolithography processes.

BACKGROUND

With the continuous development of the integrated circuit (IC) manufacturing technology, the critical dimension (CD) of ICs has been continuously reduced. When the CD of ICs is reduced to a same order as the exposure wavelength of the photolithography apparatus, an optical proximity effect (OPE) occurs. Such a phenomenon is caused by the diffraction and interference of the exposure light when the exposure light passes through a mask during the photolithography process. The diffraction and interference of the exposure light cause the deformation and distortion of the structure (or contours) of patterns of the IC when the patterns are transferred from the mask to a photoresist layer on a wafer.

To overcome the optical proximity effect, an optical proximity correction (OPC) method is often used. The OPC method pre-corrects the expected deformation and distortion of the mask patterns to cause the correction compensation value to be able to compensate the optical proximity effect generated by the exposure system of the photolithography apparatus. Accordingly, the final patterns formed on a wafer are identical to the target patterns.

The OPC method is able to correct the edge placement error (EPE) between the exposure patterns on a silicon wafer and the target patterns by multiple iterating steps. However, the OPC method is unable to correct the conflicting errors caused by the design. The conflicting errors refer to that correcting one error increases the error of other adjacent patterns. Such conflicting errors are unable to be solved simultaneously.

Thus, there is a need to develop a method that is able to solve the issue caused by conflicting errors. The disclosed methods and masks are directed to solve such an issue and other problems in the art.

BRIEF SUMMARY OF THE DISCLOSURE

One aspect of the present disclosure includes a method for correcting target patterns. The method includes providing target patterns; dividing contours of target patterns into a plurality of fragments; performing an optical proximity correction on the target patterns to obtain mask patterns; performing an optical simulation on the target patterns to obtain simulated exposure patterns; detecting the simulated exposure patterns to find out existence of at least one weak point; determining a correction window in the target patterns according to the at least one weak point; comparing the target patterns in the correction window with patterns in a corresponding region of the simulated exposure patterns to obtain a position error of each fragment; calculating an effect value of a correction value of each fragment in the correction window on position errors of all fragments in the correction window; determining the correction value of each fragment according to the effect value of the correction value of each fragment in the correction window on position errors of all fragments in the correction window and the position error of each fragment; and correcting the target patterns using the correction value of each fragment to obtain corrected target patterns.

Another aspect of the present disclosure includes a mask having corrected target patterns. The mask includes a mask substrate; and corrected target patterns formed on the mask substrate. The corrected targeted patterns is formed by providing target patterns; dividing contours of target patterns into a plurality of fragments; performing an optical proximity correction on the target patterns to obtain mask patterns; performing an optical simulation on the target patterns to obtain simulated exposure patterns; detecting the simulated exposure patterns to find out existence of at least one weak point; determining a correction window in the target patterns according to the at least one weak point; comparing the target patterns in the correction window with patterns in a corresponding region of the simulated exposure patterns to obtain a position error of each fragment; calculating an effect value of a correction value of each fragment in the correction window on position errors of all fragments in the correction window; determining the correction value of each fragment according to the effect value of the correction value of each fragment in the correction window on position errors of all fragments in the correction window and the position error of each fragment; and correcting the target patterns using the correction value of each fragment to obtain corrected target patterns.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When conflicting errors occur during optical proximity correction (OPC) process for photomask design, weak points or defects, which may include, for example, pinches, bridgings and/or imperfect contact holes, may exist simultaneously in a certain region of the circuits on a wafer. Such weak points of the photolithography process in the circuit layout may affect the properties of the finally formed circuits, or even fail the functions of the circuits.

Figure 1:
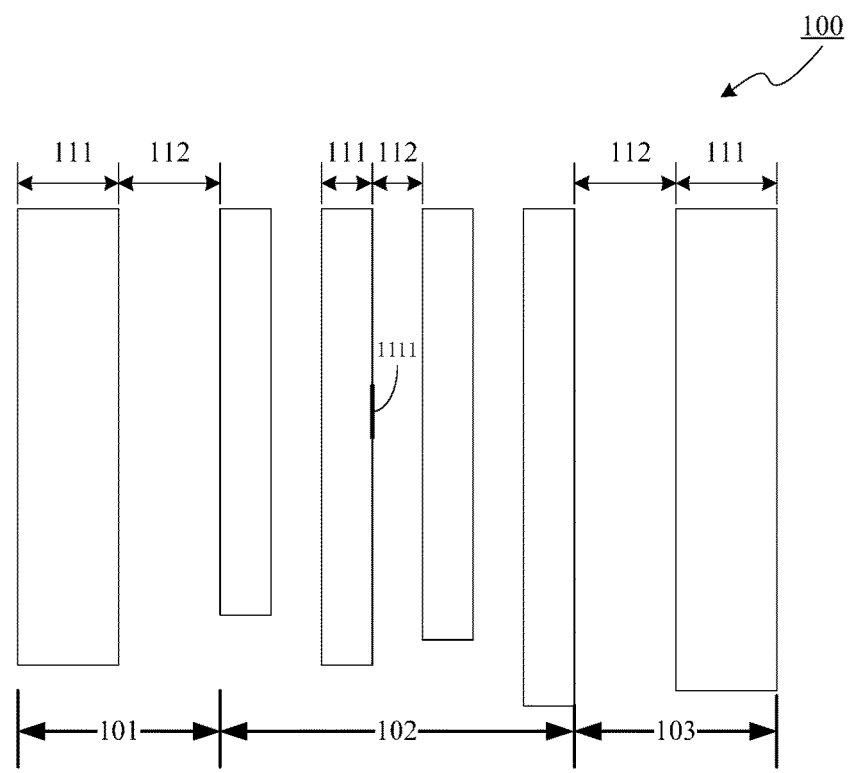
FIG. 1 illustrates a planar structure of existing target patterns.

FIG. 1 illustrates a planar structure of existing target patterns. The target patterns 300 include a first region 101, a second region 102 and a third region 103. The first region 101, the second region 102 and the third region 103 all include line regions 111 and space regions 112. The line regions 111 and the space regions 112 of the first region 101 and the third region 103 do not have weak points. When the rule-based retargeting method is used to correct the line regions 111 of the second region 102, it needs to move in or move out a certain edge fragment 1111. When the edge fragment 1111 is moved toward the line region 111, a pinch defect may be generated. When the edge fragment 1111 is moved toward the space region 112, a bridge defect may be generated. Either the pinch defect or the bridge defect will form the process weak point on the wafer; and the properties of the final circuit may be affected. Thus, the optical proximity correction process of the second region 102 faces the issue that the pinch defect and the bridge defect are needed to be solved simultaneously. However, solving one error of the two errors exacerbates the other issue. The conflicting error caused by the two errors is difficult to solve simultaneously. Thus, there is a need to develop a method to solve the conflicting errors.

The present disclosure provides a method for correcting target patterns, and a mask having corrected target patterns.

Figure 2:
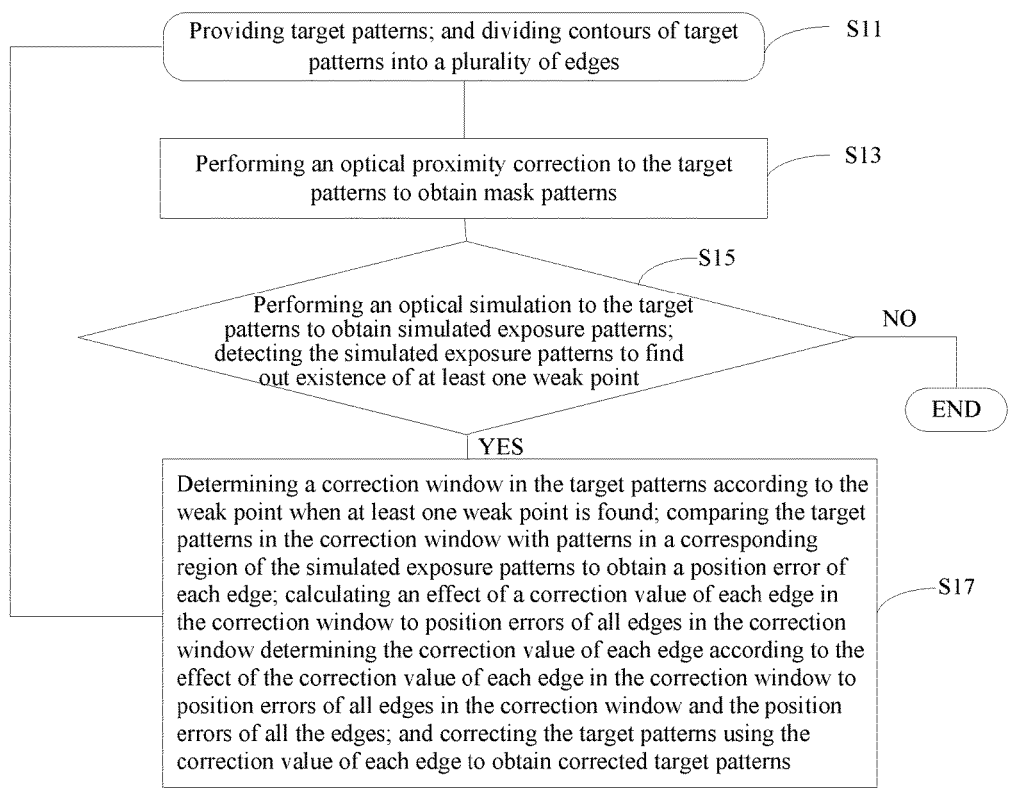
FIG. 2 illustrates a flow chart of an exemplary method for correcting target patterns consistent with the disclosed embodiments.

FIG. 2 illustrates a flow chart of an exemplary method for correcting target patterns consistent with the disclosed embodiments.

As shown in FIG. 2, the method may include providing target patterns; resolving the contours of the target patterns; and dividing the contours of the target patterns into a plurality of fragments (step S11).

Further, the method may include performing an optical proximity correction (OPC) process on the target patterns to obtain mask patterns (step S13).

In some embodiments, the OPC process may include forming an initial mask layout using a rule-based retargeting method, then performing one or more times of the OPC process on the initial mask layout to obtain the mask patterns.

In one embodiment, after forming the initial mask layout, five times of OPC iterations are used to obtain the mask patterns. The target patterns refer to the expected exposure patterns that match the function and manufacturing requirements of ICs.

Further, the method may include performing an optical simulation on the mask patterns to obtain simulated exposure patterns; and to check the existence of at least one weak point on the simulated exposure patterns.

In some embodiments, the process for checking the existence of at least one weak point on the simulated mask patterns may include using an OPC simulation software to perform an optical simulation process on the mask patterns to obtain the simulated exposure patterns so as to simulate the target patterns formed on a silicon wafer by a certain photolithography process (using certain parameters, such as the intensity and the wavelength of the exposure light, and the exposure focusing length, etc.) using the mask patterns; and comparing the simulated exposure patterns with the current target patterns. If their difference is greater than a certain threshold value at a certain location, such a location may be determined as a weak point.

In some embodiments, the region that easily has the deformation and distortion issue, i.e., weak points, may be manually determined according to experience. For example, the weak point may be portions of the exposure patterns that have small distances, and/or the portions of the exposure patterns at the L-shape corner regions, etc.

If no weak point is found in the step S15, the process for correcting the target patterns may be ended. That is, the mask patterns obtained in the step S13 may be the finally formed mask patterns.

If a weak point is found in the step S15, as shown in FIG. 2, the method for correcting target patterns may also include the step S17.

Figure 3:
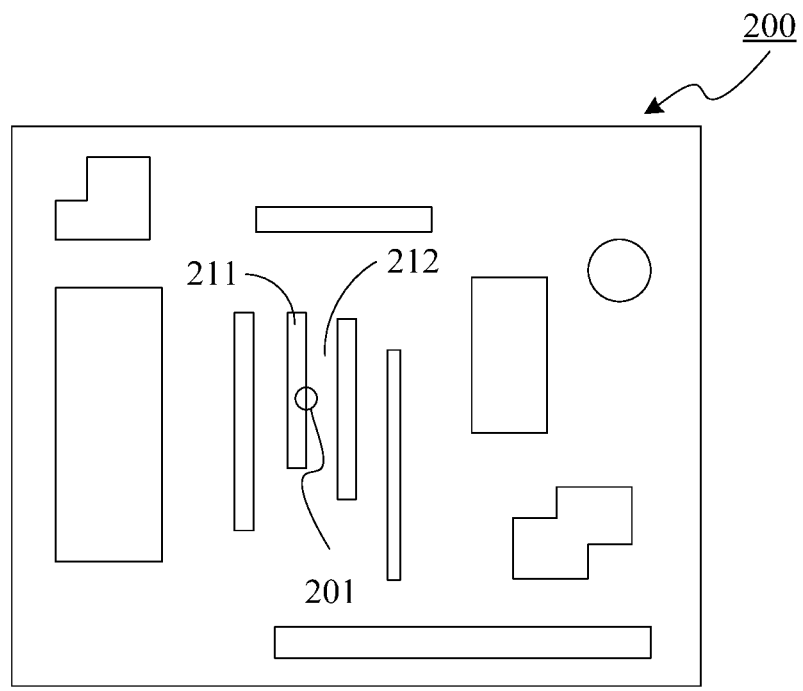
FIG. 3 illustrates a planar structure of simulated exposure patterns consistent with the disclosed embodiments.

In one embodiment, a weak point is found in the step S15. FIG. 3 illustrates a planar structure of exemplary simulated exposure patterns consistent with the disclosed embodiments. The simulated exposure patterns 200 illustrated in FIG. 3 are for illustrative purposes only, not intended to limit the scope of the present disclosure.

As shown in FIG. 3, the weak point on the simulated exposure patterns 200 detected in the step S13 may be referred to as the weak point 201. In one embodiment, the threshold value may be pre-set; and may be determined by the critical dimension of the to-be-formed device. The threshold value may often be 3%-10% of the critical dimension of the to-be-formed device. Because the weak point 201 may be at the boundary region between the connection line 211 and the space region 212, the weak point 201 may be a conflicting weak point. That is, the weak point 201 may belong to both the pinch-type weak point and the bridge-type weak point. When the OPC method is used to correct the punch-type error, the bridge-type error may be more severe. Thus, the pinch-type error and the bridge-type error may be unable to solve simultaneously.

The weak point 201, belonging to both the pinch-type weak point and the bridge-type weak point, is for illustrative purposes only to describe the conflicting error caused by the conflicting weak point; and is not intended to limit the scope of the present disclosure. The conflicting weak point may locate at the boundary regions of a plurality of patterns of the simulated exposure patterns. The OPC process to the conflicting weak point may affect the plurality of patterns; and the conflicting errors may be generated.

As shown in FIG. 2, if a weak point is found in the simulated exposure patterns in the step S15, the method for correcting the target patterns may also include the step S17. The step S17 may include determining a correction window covering a partial number of the target patterns according to the weak point; comparing target patterns in the correction window with the patterns in the corresponding region of the simulated exposure patterns to obtain the position error of each fragment of the patterns in the correction window; and calculating the effect value of the correction value of each fragment in the correction window to the position errors of all the fragments in the correction window; determining the correction value of each fragment according to the effect value of the correction value of each fragment in the correction window to the position errors of all the fragments in the correction window and the position error of each fragment; and correcting the target patterns to obtain the corrected target patterns using the correction value of each fragment.

Figure 4:
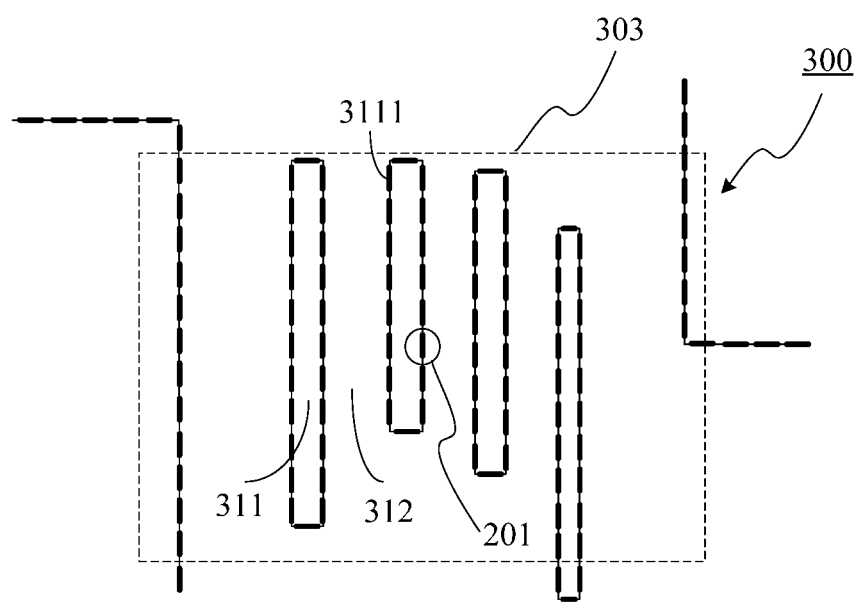
FIG. 4 illustrates a planar structure of an exemplary correction window determined by weak points in target patterns consistent with the disclosed embodiments.

FIG. 4 illustrates a planar view of an exemplary correction window determined in the target patterns according to a weak point consistent with the disclosed embodiments. As shown in FIG. 4, the dashed-line frame refers to the correction window 303 containing a weak point 201. The target patterns in the correction window 303 may include a plurality of connection lines 311; and regions between adjacent connection lines 311 may be referred to as the space regions 312. The contours of the connection lines 311 may be divided into a plurality of fragments 3111. The target patterns in the correction windows 303 may be compared with the patterns in the corresponding region of the simulated exposure patterns (not shown); and the position error of each edge (EPE) in the correction window 303 may be obtained.

The shape of the correction window 303 may be rectangle, or polygonal, etc. The area of the correction window 303 may be in a range of approximately 200 nm×200 nm to 500 nm×500 nm. In one embodiment, the shape of the correction window 303 is rectangle; and the area of the correction window 303 may be approximately 400 nm×300 nm. The weak point 201 may be at the center of the correction window 303.

In some embodiments, the shape of the correction window may be polygonal. There may be a plurality of weak points in the correction window.

In some embodiments, the number of the fragments of the target patterns 300 included in the correction window may be N. The position error of the $i^{th}$ fragment may be defined as $\Delta Epe_i = CD_i(target) - (contour)$. $CD_i(target)$ may refer to the position of the $i^{th}$ fragment in the target patterns 300; and $CD_i(contour)$ may refer to the position of the $i^{th}$ fragment in the simulated exposure patterns 200. Where i may be smaller than, or equal to N.

In some embodiments, calculating the effect value of the correction value of each fragment in the correction window 303 to the position errors of all the fragments in the correction window 303 may include calculating the position disturbing matrix of all the fragments in the correction window 303.

Specifically, the diagonal elements of the position disturbing matrix may be defined as the position error of any selected fragment generated by itself when a unit-distance correction value is applied to the selected fragment of all the fragments in the correction window 303. The off-diagonal elements of the position disturbing matrix may be defined the position error generated by all other fragments than the selected fragment when a unit-distance correction value is applied to the selected fragment of all the fragments in the correction window 303. The position disturbing matrix obtained by such a method may not only include the effect value to the position error of the selected fragment (element) itself when the selected fragment is corrected with a unit-distance, but also may include the effect value to the position error of other fragments.

Because the position disturbing matrix may consider the proximity (correlation) effect among all the fragments in the region having the weak point, the correction values determined by the position disturbing matrix may all be micro shifts. The resolution of the correction value may be sufficiently high. Thus, it may allow the correction of the target patterns and the subsequent OPC iterations to converge rapidly.

In some embodiments, such a matrix based-process may be referred as a real-time retargeting operation. The real-time retargeting operation may have a fast and stable convergence.

Specifically, the number of the fragments in the correction window 303 may be "n", the method for calculating the position disturbing matrix of all the fragments in the correction window 303 may be as following. The position disturbing matrix T may be an n×n order matrix. The elements of the position disturbing matrix may be $$T_{ij} = \frac{\partial Epe_i}{\partial f_j}.$$

The elements may represent the effect value of the correction value of the $j^{th}$ fragment to the position error of the $i^{th}$ fragment. Where $1 \le i$, $j \le n$; and i and j may be both positive integers. The multiple-dimensional vector form of the position disturbing matrix T may be $$T = \begin{pmatrix} \frac{\partial Epe_1}{\partial f_1} & \cdots & \frac{\partial Epe_1}{\partial f_n} \\ \vdots & \ddots & \vdots \\ \frac{\partial Epe_n}{\partial f_1} & \cdots & \frac{\partial Epe_n}{\partial f_n} \end{pmatrix} \quad (1)$$

As shown in the equation (1), the diagonal elements of the position disturbing matrix T:

$$\frac{\partial Epe_1}{\partial f_1}, \frac{\partial Epe_2}{\partial f_2}, \ldots, \frac{\partial Epe_i}{\partial f_i}, \ldots, \frac{\partial Epe_n}{\partial f_n} \quad (i = j)$$

represent the position errors generated by the $i^{th}$ fragment when a unit-distance correction value is applied to the $i^{th}$ fragment. The off-diagonal elements of the position disturbing matrix T:

$$\frac{\partial Epe_i}{\partial f_j}$$

($i \ne j$) represent the position error caused by the $j^{th}$ fragment when the unit-distance correction value is applied to the $i^{th}$ fragment.

In some embodiments, the diagonal elements $T_{ii}$ of the position disturbing matrix T may be greater than the off-diagonal elements $T_{ij}$ of the position disturbing matrix T.

In some embodiments, the value of the diagonal elements $T_{ii}$ of the position disturbing matrix T may be in a range of approximately 1 nm-5 nm. The value of the off-diagonal elements $T_{ij}$ of the position disturbing matrix T may be in a range of approximately 0-1 nm.

In one embodiment, the number of the fragments is 4, the position disturbing matrix T may be a 4×4 order of matrix, the vector form of the position disturbing matrix T may be:

$$T = \begin{pmatrix} 2.1 & 0.7 & 0.5 & 0.9 \\ 0.2 & 3.8 & 1 & 0.1 \\ 0.8 & 0.1 & 4.6 & 0.5 \\ 0.1 & 0.6 & 0.4 & 1.9 \end{pmatrix} \quad (2)$$

Taking "n" equal to 4 illustrated in the equation (2) is for illustrative purposes only. In the real OPC simulation, the contours of the simulated exposure patterns may include a plurality of fragments; and the number "n" of the fragments may be dependent of the area of the selected correction window.

After calculating the position disturbing matrix T of all the fragments in the correction window, the correction value of each fragment may be determined according to the position disturbing matrix and the position error of each fragment.

In some embodiments, the method for determining the correction value of each fragment according to the position disturbing matrix and the position error of each fragment may include calculating the inverse matrix $T^{-1}$ of the position disturbing matrix T; and calculating the correction value of each fragment using the inverse matrix $T^{-1}$ and the position error $\Delta Epe_i$ of the each fragment.

Specifically, the correction value $\Delta f_i$ of each fragment may be calculated from the vector products of the inverse matrix $T^{-1}$ and the position error vectors $\{\Delta Epe_j\}$ (j=1, 2, ... n) of each fragment. That is, $\Delta f_i = \Sigma_j (T^{-1})_{ij} \Delta Epe_j$ i, j=1, 2, ... n (3).

As shown in equation (3), the correction value of the $i^{th}$ fragment may consider the effect value of the correction value of the $i^{th}$ fragment to the position errors of all the fragments. That is, the correction value of the $i^{th}$ fragment may be an effective correction value determined by considering the proximity (correlation) effect value of all the "n" fragments in the correction window.

In one embodiment, the correction value $\Delta f_i$ of each fragment may not be greater than 5 nm. The correction value $\Delta f_i$ of each fragment obtained by the disclosed target pattern correction method may all be relatively small shifts; and may not affect the functions of the entire target patterns.

Further, after obtaining the correction value of each fragment, the target patterns may be corrected using the correction values. Thus, the corrected target patterns may be obtained.

Specifically, according to the correction value $\Delta f_i$ of each fragment, only the target patterns in the correction window 303 may be corrected. The patterns in the other regions may be kept intact; and the corrected target patterns may be obtained.

In some embodiments, the method for correcting the target patterns may include a plurality of loops. Each loop may include the step S11, the step S13, the step S15 and the step S17. The corrected target patterns in a previous loop in the plurality of loops may be used as the target patterns of a next loop.

Specifically, after performing the step S17, the step S11 may be performed, including providing target patterns; and dividing the contours of the target patterns into a plurality of fragments, etc. The target patterns may the target patterns obtained from the correction in the step S17.

When no weak point is detected in the step S15 in a certain loop of the plurality of loops, the loops may be ended. That is, the target pattern correction process may be finished.

Thus, in the disclosed methods for correcting target patterns, the weak point on the mask layout may be detected first, then the correction window may be determined according to the weak point. Then, the effect value of the correction value of each fragment to the position errors of all the fragments in the correction window may be calculated. According to the effect value of the correction value of each fragment to the position errors of all the fragments in the correction window and the position error of each fragment, the correction value of each fragment may be calculated. Then, the target patterns may be corrected using the correction value of each fragment to obtain the corrected target patterns. The corrected target patterns may be used as new target patterns to perform further OPC iterations to obtain new mask patterns. The disclosed method may perform the correction using the weak point on the target patterns, the issue that the OPC method is unable to correct the conflicting weak point on the mask patterns may be overcome. Accordingly, the conflicting errors caused by the problematic photolithography mask design may be avoided.

Further, the position disturbing matrix may calculate the effect value of the correction value of each fragment of the target patterns to the position errors of other fragments in the proximity regions around the weak point. That is, the proximity (correlation) effect among all the fragments around the weak point may be considered. Thus, the correction value of each fragment determined by the position disturbing matrix and the position error of each fragment may be have a relatively high resolution. Accordingly, the correction of the target patterns and the subsequently OPC iterations may converge rapidly and stably. On one hand, the calculation time may be significantly saved. On the other hand, the conflicting weak point caused by the problematic photolithography mask design may be eliminated.

After correcting the target patterns, the corrected target patterns may be transferred to form a mask. That is, a mask may be formed; and the mask may have the corrected target patterns. The mask may be used in a photolithography process to form the target patterns in the photoresist layer on a wafer.

The mask may be formed by providing a mask substrate; and forming the corrected target patterns on the mask substrate. The mask substrate may be a transparent substrate. The corrected target patterns may be formed on the mask substrate by any appropriate process, such as a direct printing process, an electron-beam lithography process, or a laser writing process, etc.

Thus, the present disclosure also provides a mask for a photolithography process. The mask may include a mask substrate; and a plurality of corrected target patterns obtained by the disclosed target pattern correction method. The mask may be loaded in a photolithography apparatus; and a wafer with a photoresist layer may also be loaded in the photolithography apparatus. Then, an exposure process may performed; and target patterns may be formed in the photoresist layer. The disclosed mask may have no pinch-type defects and/or bridge-type defects. Thus, the quality of the target patterns formed on the wafer may be improved; and the electrical properties of the final semiconductor structures may be improved.

Comparing with the existing methods, the disclosed target pattern correction method may have following advantages.

First, in the disclosed target pattern correction methods, the weak point on the mask layout may be detected first, then the correction window may be determined according to the weak point. Then, the effect value of the correction value of each fragment to the position errors of all the fragments in the correction window may be calculated. According to the effect value of the correction value of each fragment to the position errors of all the fragments in the correction window and the position error of each fragment, the correction value of each fragment may be calculated. Then, the target patterns may be corrected using the correction value of each fragment to obtain the corrected target patterns. The corrected target patterns may be used as new target patterns to perform further OPC iterations to obtain new mask patterns. The disclosed target pattern correction method may perform the correction using the weak point on the target patterns, the issue that the OPC method is unable to correct the conflicting weak point on the mask patterns may be overcome. Accordingly, the conflicting errors caused by the problematic photolithography mask design may be avoided.

Further, the position disturbing matrix may calculate the effect value of the correction value of each fragment of the target patterns to the position errors of other fragments in the proximity regions around the weak point. That is, the proximity (correlation) effect among all the fragments around the weak point may be considered. Thus, the correction value of each fragment determined by the position disturbing matrix and the position error of each fragment may be have a relatively high resolution. Accordingly, the correction of the target patterns and the subsequently OPC iterations may converge rapidly and stably. On one hand, the calculation time may be significantly saved. On the other hand, the conflicting weak point caused by the problematic photolithography mask design may be eliminated.

In various embodiments, all or some of the exemplary steps in the disclosed methods may be implemented by a computer system. For example, the computer system may include: at least one processing element such as a central processing unit (CPU) or a processor, and a memory. Instructions/programs may be stored on the memory such as a computer readable storage medium including, for example, a random access memory (RAM)/read-only memory (ROM), a magnetic disk, an optical disc, or the like. The at least one processing element may be configured to implement the disclosed methods according to the instructions/programs stored on the memory.

In one embodiment, the memory is a non-transitory computer readable recording medium and configured in the computer system by using the computer readable recording medium, and to perform the methods disclosed herein.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for correcting target patterns, comprising:
providing target patterns;
dividing contours of target patterns into a plurality of fragments;
performing an optical proximity correction on the target patterns to obtain mask patterns;
performing an optical simulation on the target patterns to obtain simulated exposure patterns;
detecting the simulated exposure patterns to find out existence of at least one weak point;
determining a correction window in the target patterns containing the at least one weak point;
comparing the target patterns in the correction window with patterns in a corresponding region of the simulated exposure patterns to obtain a position error of each fragment;
calculating an effect value of a correction value of each fragment in the correction window on position errors of all fragments in the correction window;
determining the correction value of each fragment according to the effect value of the correction value of each fragment in the correction window on position errors of all fragments in the correction window and the position error of each fragment; and
correcting the target patterns using the correction value of each fragment to obtain corrected target patterns.

2. The method according to claim 1, wherein:
the at least one weak point is a conflicting weak point;
the conflicting weak point is located at boundary regions of a plurality of patterns of the simulated exposure patterns; and
the optical proximity correction to the simulated exposure patterns at the weak point affects the plurality of patterns simultaneously, wherein the optical proximity correction to the simulated exposure patterns at the weak point increase error of adjacent pattern in response to decreasing an error of the conflicting weak point.

3. The method according to claim 1, wherein calculating the effect value of the correction value of each fragment in the correction window to position errors of all fragments in the correction window comprises:
calculating a position disturbing matrix T of all the fragments in the correction window.

4. The method according to claim 3, wherein the position disturbing matrix T of all the fragments in the correction window comprises:
diagonal elements, which are position errors generated by any selected fragment when a unit-distance correction value is applied to the selected fragment of the plurality of fragments in the correction window; and
off-diagonal elements, which are position errors generated by all other fragments than the selected fragment when the unit-distance correction value is applied to the selected fragment of the plurality of fragments in the correction window.

5. The method according to claim 4, wherein:
the diagonal elements of the position disturbing matrix T are greater than the off-diagonal elements of the position disturbing matrix T.

6. The method according to claim 4, the number of the fragments in the correction window being "n", wherein:
the position disturbing matrix T is an n×n order matrix, and
elements of the position disturbing matrix T are $$T_{ij} = \frac{\partial Epe_i}{\partial f_j},$$

presenting an effect value of the correction value of a $j^{th}$ fragment to a position error of the $i^{th}$ fragment, wherein 1≤i, j≤n.

7. The method according to claim 6, when i=j, wherein:
values of the elements $T_{ii}$ are in a range of approximately 1 nm to 5 nm.

8. The method according to claim 6, when i≠j, wherein:
values of the elements $T_{ij}$ are in a range of approximately 0 to 1 nm.

9. The method according to claim 6, wherein determining the correction value of each fragment according to the effect value of the correction value of each fragment in the correction window to position errors of all fragments in the correction window and the position errors of all the fragments comprises:
calculating an inverse matrix $T^{-1}$ of the position disturbing matrix T; and
calculating the correction value of each fragment according to the inverse matrix $T^{-1}$ and the position error of each fragment.

10. The method according to claim 9, wherein:
a correction value of an $i^{th}$ fragment of the n fragments is $\Delta f_i = \Sigma_j (T^{-1})_{ij} \Delta Epe_j$, i,j=1, 2, . . . n,
wherein: $\Delta Epe_j$ is a position error of a $j^{th}$ fragment; and $\Delta f_i$ is the correction value of the $i^{th}$ fragment.

11. The method according to claim 1, wherein:
the correction value of each fragment is less than, or equal to approximately 5 nm.

12. The method according to claim 1, wherein detecting the simulated exposure patterns to find out if there is at least one weak point comprises:
comparing the simulated exposure patterns with the target patterns; and
determining a certain location to be the weak point if the difference between the exposure patterns and the target patterns is greater than a threshold value.

13. The method according to claim 1, wherein:
a shape of the correction window is one of rectangular and polygonal.

14. The method according to claim 1, wherein:
an area of the correction window is in a range of approximately 200 nm×200 nm to 500 nm×500 nm.

15. The method according to claim 1, wherein:
the weak point is at the center of the correction window.

16. The method according to claim 1, wherein:
the method for correcting the target patterns includes a plurality of loops;
each loop includes providing target patterns, dividing contours of the target patterns into a plurality of fragments, performing an optical proximity correction to the target patterns to obtain mask patterns, performing an optical simulation on the mask patterns to obtain simulated exposure patterns, detecting the simulated exposure patterns to find out existence of at least one weak point, determining a correction window in the target patterns according to the at least one weak point, comparing the target patterns in the correction window with patterns in a corresponding region of the simulated exposure patterns to obtain a position error of each fragment, calculating an effect value of a correction value of each fragment in the correction window on position errors of all fragments in the correction window, determining the correction value of each fragment according to the effect value of the correction value of each fragment in the correction window on position errors of all fragments in the correction window and the position error of each fragment, correcting the target patterns using the correction value of each fragment to obtain corrected target patterns value of each fragment in the correction window to position errors of all fragments in the correction window and the position errors of all the fragments, and correcting the target patterns using the correction value of each fragment to obtain corrected target patterns; and
the corrected target patterns obtained from a previous loop of the plurality of loops are used as target patterns of a next loop.

17. The method according to claim 16, wherein:
the plurality of loops are ended when no weak point is found in a certain loop of the plurality of loops.

18. A mask, comprising:
a mask substrate; and
corrected target patterns formed on the mask substrate, wherein the corrected targeted patterns are obtained by:
providing target patterns;
dividing contours of target patterns into a plurality of fragments;
performing an optical proximity correction on the target patterns to obtain mask patterns;
performing an optical simulation on the target patterns to obtain simulated exposure patterns;
detecting the simulated exposure patterns to find out existence of at least one weak point;
determining a correction window in the target patterns containing the at least one weak point;
comparing the target patterns in the correction window with patterns in a corresponding region of the simulated exposure patterns to obtain a position error of each fragment;
calculating an effect value of a correction value of each fragment in the correction window on position errors of all fragments in the correction window;
determining the correction value of each fragment according to the effect value of the correction value of each fragment in the correction window on position errors of all fragments in the correction window and the position error of each fragment; and
correcting the target patterns using the correction value of each fragment to obtain corrected target patterns.

19. The mask according to claim 18, wherein:
the effect value of the correction value of each fragment in the correction window to position errors of all fragments in the correction window is obtained by calculating a position disturbing matrix of all the fragments in the correction window.

20. The mask according to claim 19, wherein:
the correction value of each fragment is determined by the disturbing matrix of all the fragments and the position error of each fragment.

* * * * *